United States Patent [19]

Peterson et al.

[11] 4,079,305

[45] Mar. 14, 1978

[54] POWER SUPPLY FOR HIGH POWER LOADS

[75] Inventors: Harold A. Peterson; Narendra Mohan, both of Madison, Wis.

[73] Assignee: Wisconsin Alumni Research Foundation, Madison, Wis.

[21] Appl. No.: 623,421

[22] Filed: Oct. 17, 1975

[51] Int. Cl.² .............................................. H02J 15/00
[52] U.S. Cl. ...................... 363/27; 307/104; 363/14
[58] Field of Search ...................... 321/2, 5, 8 CD, 18; 307/82, 90, 104, 151; 323/123, 128

[56] References Cited

U.S. PATENT DOCUMENTS

| | | | |
|---|---|---|---|
| 3,611,114 | 10/1971 | Sole | 321/8 CD |
| 3,622,866 | 11/1971 | Boehringer | 321/2 |
| 3,699,425 | 5/1971 | Hermansson et al. | 323/123 |
| 3,739,255 | 6/1973 | Leppert | 321/18 |
| 3,932,799 | 1/1976 | Frank et al. | 323/128 |
| 3,953,779 | 4/1976 | Schwarz | 321/2 |

*Primary Examiner*—William H. Betta, Jr.

*Attorney, Agent, or Firm*—Harry C. Engstrom; Theodore J. Long

[57] ABSTRACT

A power supply capable of transferring power at high current and voltage levels to a load which may be highly inductive. The power supply includes an inverter for receiving DC power and inverting it to an AC intermediate signal. The intermediate signal is rectified by a converter to provide a DC output voltage to a load. Commutation of the controlled rectifying devices within the inverter and converter are provided by capacitors connected across the output terminals of the inverter. The DC output voltage provided to the load is controlled by the frequency of the firing signals provided to the controlled rectifying devices within the inverter. A large energy storage inductor, which may be superconductive, is connected to the inverter and may be utilized to provided the pulses of power required by the load. A converter connected to an AC power system is provided to supply external power and to recharge the current flowing in the energy storage inductor. Power may be transferred reversibly, from the energy storage inductor to a load inductor and back again.

17 Claims, 5 Drawing Figures

POWER SUPPLY FOR HIGH POWER LOADS

BACKGROUND OF THE INVENTION

1. Field of the Invention

This invention pertains generally to the field of power supply circuits and systems, and more particularly to circuits which are capable of controllably transferring and recovering energy at high instantaneous power levels between a power source and a load.

2. Description of the Prior Art

The problem of providing regulated DC voltage to a load from an AC source is a common one, and, of course, numerous power supply systems have been developed. In power supplies for loads which require large amounts of power, it is important to minimize the power that is consumed in losses in the power supply system itself. A common solution to the power supply problem at large power levels is the use of a controlled rectifier bridge which employs thyristors to provide a controlled amount of power to the load. By adjustment of the firing angle of the thyristors, the average voltage supplied to the load may be controlled over reasonable design limits.

The difficulty of supplying repetitive pulsed power loads which are highly inductive is particularly acute. Such inductive loads may demand a large amount of instantaneous power from the power system which is substantially greater than the average power which must be provided by the system. Loads of this nature are typical of the inductive loads that are contemplated for fusion reactors such as the Tokamak reactor, and for present and contemplated particle accelerators and other machines used in high energy physics which employ large electrical magnets.

In a typical controlled rectifier or converter such as a Graetz bridge, the amount of power supplied to an inductive load may be controlled by controlling the delay angle of the firing signal supplied to the gate inputs of the thyristors in the bridge. Such a system may also provide the capability of reversing the flow of power such that power is supplied from the inductor to the power system, depending on the magnitude of the delay angle. While such converters are useful for transmitting power to an inductive load, they give rise to unacceptable voltage dips in the AC power system when the converter is attempting to provide a controlled and regulated voltage to a large inductive load, such as is required when a fusion reactor winding is being charged and discharged. Moreover, the charging of such an inductive load may require large amounts of momentary power from the system over a relatively short period of time, with this power later being returned to the power system when the inductive load is discharged. While the average power demand on the power system may be very small if the controlled rectifier and inductive load are nearly lossless, the large amounts of peak power required (possibly up to 1000 megawatts) from the power system makes such a scheme inefficient and possible infeasible for the very large pulsed power surges that will be required by fusion reactors.

Energy storage devices such as storage batteries and pumped hydro-storage may be utilized under some circumstances to augment the capabilities of the power system for the short pulsed surges of power that are required, and systems of this type have been considered for supplying the daily peak demands of commercial power systems. Large superconductive energy storage inductors coupled to the commercial power system by means of a converter may also be utilized to augment the power system in supplying the pulsed peak power requirements. See e.g. R. W. Boom and H. A. Peterson, "Superconductive Energy Storage for Power Systems," *IEEE Transactions on Magnetics*, MAG-8, Sept. 1972, pp. 701–703. While such energy storage systems are useful to augment the power supplied from the commercial power system, they are not well adapted to limiting the power system voltage dips when repetitively pulsed power loads of large magnitude are being supplied.

Additional problems are encountered because of the high voltages and high currents encountered when supplying loads which require large amounts of real or reactive power, such as the windings of particle accelerator magnets or proposed fusion magnets. Most power supply systems require a metal core transformer having numerous windings, and transformers of this type which are capable of carrying the high voltages and currents required are expensive and bulky. In addition, such transformers contribute greatly to the overall energy losses in the system.

SUMMARY OF THE INVENTION

We have intended a power supply for high power loads and repetitively pulsed loads which is capable of transferring power from a highly inductive (constant current) power source to a highly inductive load. Our power supply may also be used to transform DC voltages from one voltage level to another at high voltages and currents, without the need for transformers. Power can be transferred reversibly through the power supply, from an inductive load back to an inductive source. With an energy source inductor included in our power supply, power may be delivered from a commercial power system to a pulsed load without imposing undesirable voltage dips on the power system.

The power supply has a power transfer circuit which is adapted to receive DC input voltage and current at input input terminals thereof, and provides a controllable DC output voltage to a load at the output terminals of the power transfer circuit. The power transfer circuit includes an inverter which receives the DC input and inverts it to an AC intermediate voltage at the intermediate output terminals of the inverter. Capacitors are connected across the intermediate output terminals of the inverter to provide commutation of controlled rectifying devices, or thyristors, which are connected in a bridge circuit within the inverter. The voltages on the intermediate output terminals of the inverter are then rectified by a converter which delivers a controllable DC output voltage to the load. The power transfer circuit output voltage at the output terminals of the converter is substantially inversely proportional to the frequency of the intermediate inversion signal on the intermediate output terminals of the inverter, thus allowing control of this output voltage by control of the inversion frequency. The frequency of the intermediate inversion is controlled by an inverter firing angle controller which supplies firing pulses to the control inputs of the thyristors within the inverter, to cause them to fire in the proper sequence to provide an AC intermediate voltage.

The power transfer circuit may be utilized in conjunction with a storage inductor, which will preferably comprise a superconducting magnet capable of carrying large currents with minimal resistive losses. The energy in the storage inductor may be transmitted via the power transfer circuit to an inductive load, such as the windings of a fusion reactor, at a controlled voltage and for a desired period of time. The use of controlled rectifying devices within the converter portion of our power supply allows the energy that is stored within the load inductor to be reversibly transferred back to the storage inductor by operating the converter as an inverter, and the inverter as a rectifier, thereby reversing the operation of the power transfer circuit. The storage inductor may have power supplied thereto by a converter connected in series therewith which is provided with power from the AC power system, with the power system charging the storage inductor and supplying any resistive losses or other losses within the system. With a suitably large energy storage inductor, the power P and volt-amperes reactive (VARS) Q demanded from the power system source are essentially constant, and free of pulsations.

Further objects, features and advantages of our invention will be apparent from the following detailed description taken in conjunction with the accompanying drawings showing a preferred embodiment of a power supply for high power loads exemplifying the principles of our invention.

DESCRIPTION OF THE PREFERRED EMBODIMENT

Figure 1:
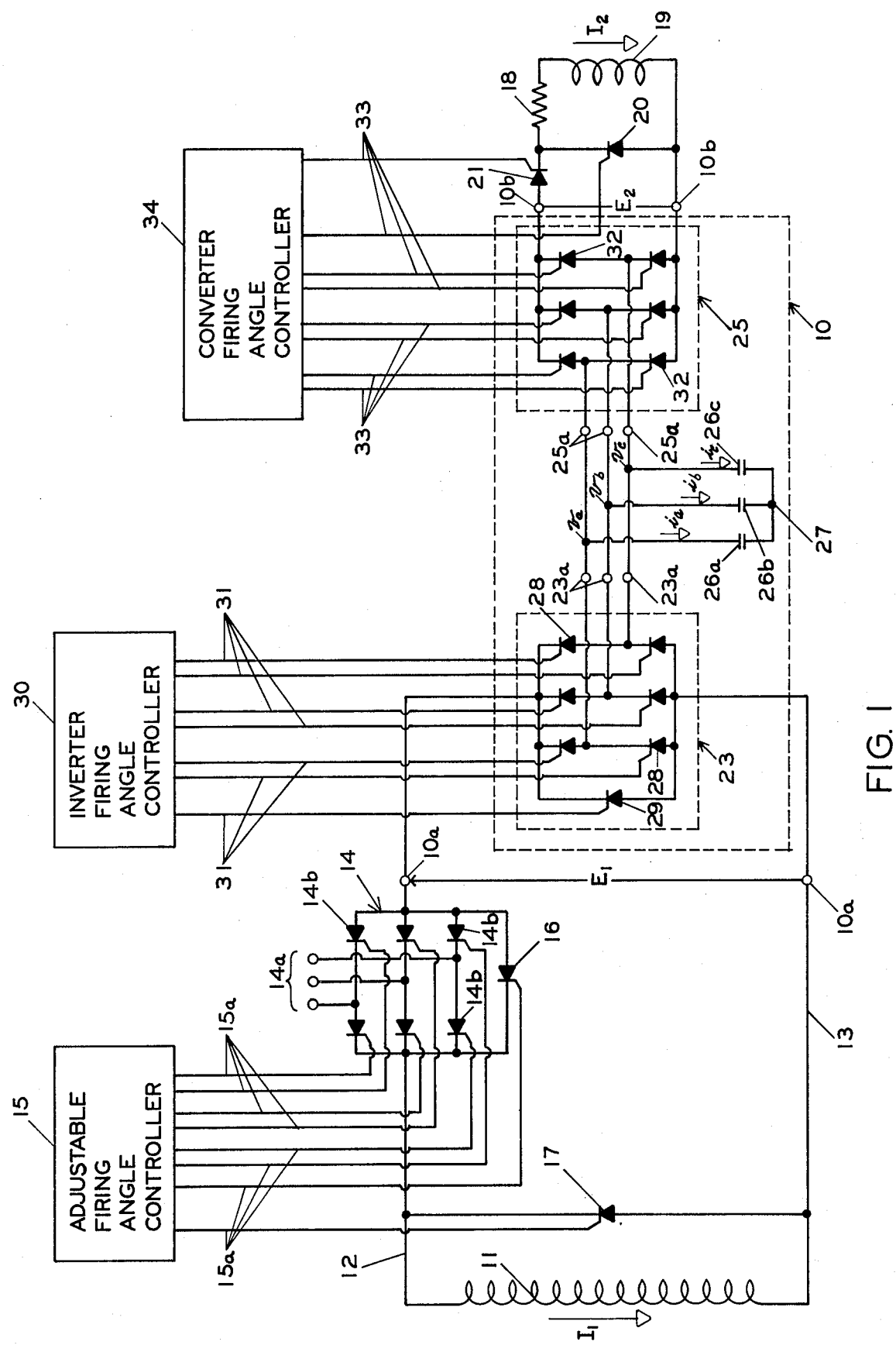
FIG. 1 is a schematic view of our power supply for high power loads shown connected to a load and having input terminals connectable to an external source of power.

Referring now more particularly to the drawings, wherein like numerals refer to like parts throughout the several views, a preferred embodiment of the power transfer circuit portion of our power supply for high power loads is shown generally within the dashed lines labeled 10 in FIG. 1. The input terminals 10a of the power transfer circuit 10 are connected to a storage inductor 11 by electrical conductor leads 12 and 13. The storage inductor or magnet 11 would preferably have a superconductive winding to carry the magnitude of currents required for a high power inductive energy storage system. A Graetz type controlled rectifier bridge shown generally at 14 in FIG. 1 is connected in a circuit in series with the storage inductor 11 and the power transfer circuit 10, and is provided for the purpose of selectively delivering power from a power system connected to the input terminals 14a of the bridge 14 to the storage inductor 11. As shown in FIG. 1, the controlled rectifier or converter 14 may consist of a bridge circuit employing controlled rectifying devices 14b having control inputs or gate inputs, with such devices hereafter being referred to as generally as thyristors, although other similar switching or rectifying devices may be utilized. The thyristors are fired at any desired firing delay angle by pulses provided to the gate inputs on control leads 14a by an adjustable firing angle controller 15. A bypass thyristor 16 is connected in parallel with the rectifier 14 to allow the rectifier to be bypassed as desired when a supply of power to the storage inductor is not required. The thyristor 16 is preferably controlled by gate pulses provided thereto by the firing angle controller 15. A thyristor 17 is connected in parallel with the storage inductor 11 and may be fired by applying a gate signal from the firing angle controller 15 to the gate input of the thyristor 17. Firing of the thyristor 17 allows the current in the storage inductor 11 to free-wheel through the thyristor 17, thus bypassing the remainder of the circuitry.

The output terminals 10b of the power transfer circuit 10 are connected to a load which consists of a load resistor 18 serially connected with a load inductor 19. The resistor 18 may be any power consuming load, or may be considered to represent the small resistance associated with the winding of a magnet coil having an inductance represented by the load inductor 19. A thyristor 20 is connected in parallel with the load resistor 18 and load inductor 19 to selectively allow free-wheeling of any current built up in the inductor 19 through the thyristor 20 and the load resistor 18. A cut off thyristor 21 may be connected in series with the load resistor 18 and the load inductor 19 as shown in FIG. 1, and is provided for the purpose of controllably isolating the load resistor and inductor from the voltage $E_2$ across the output terminals 10b during the start up operation of the transfer circuit. The start up operation will be described more fully below.

The power transfer circuit 10 as shown in FIG. 1 has an inverter portion, shown generally within the dashed lines labeled 23, which inverts a direct current type (DC) signal applied to the transfer circuit input terminals 10a into a three-phase alternating current (AC) output voltage at the intermediate output terminals 23a of the inverter 23, with the voltages on the three terminals 23a being designated as $v_a$, $v_b$, and $v_c$. A converter, shown generally within the dashed lines labeled 25 in FIG. 1, has input terminals 25a which are directly connected to the intermediate output terminals 23a of the inverter. The converter rectifies the three-phase AC voltage signal from the inverter to provide a DC output voltage $E_2$ at the output terminals 10b of the converter and the power transfer circuit. Each of the intermediate output terminals 23a of the inverter has one of three capacitors 26a, 26b and 26c connected thereto, with each of these capacitors preferably being connected together at a common node 27 as shown in FIG. 1. The capacitors provide for commutation of the thyristors within the inverter 23 without the need for other commutation circuitry. While the capacitors 26a, 26b and 26c are shown in the preferred embodiment in FIG. 1 connected to the common node 27, it is apparent that a capacitor could be connected between each two of the intermediate output terminals 23a taken as pairs (a "delta" connection rather than a "wye" connection), and would result in an equivalent circuit to that shown in FIG. 1.

The inverter 23 preferably consists of a bridge inverter circuit as shown in FIG. 1, with the inverter bridge made up by three sets of serially connected pairs of thyristors 28 which are connected in parallel between the input terminals 10a, with the thyristors 28 being poled to conduct forwardly in the direction of the current $I_1$ flowing in the storage inductor 11. The connection between each pair of thyristors 28 is connected to one of the intermediate output terminals 23a, 23b and 23c. Another thyristor 29 is connected between the input terminals 10a to selectably bypass the bridge circuit thyristors 28 within the inverter 23 when it is desired to allow the current in the storage inductor 11 to merely free-wheel without being transmitted through the power transfer circuit 10. The firing of the inverter bridge thyristors 28 and the bypass thyristor 29 is controlled by an inverter firing angle controller 30 which applies electrical signals to the gate inputs of the thyristors through control lines 31 to turn the thyristors 28 on to a conducting state in a time sequence which produces a time varying AC voltage across the inverter intermediate output terminals 23a.

The voltages $v_a$, $v_b$, and $v_c$ on the inverter intermediate output terminals 23a with respect to the common node 27, will be alternating voltages of substantially identical waveform, with the three voltage waveforms being approximately 120° out of phase with each other. The converter 25 preferably consists of a rectifier bridge having three serially connected pairs of rectifying devices 32, preferably thyristors, connected in parallel between the output terminals 10b of the power transfer circuit 10. Each pair of thyristors 32 is connected at a point in the electrical connection between the two thyristors to one of the converter input terminals 25a. It is not necessary for the rectifying devices 32 to be controlled rectifiers as long as the storage inductor current is maintained in excess of the load inductor current. They may be simply diodes if power is to be transmitted only from the input terminals 10a to the output terminals 10b. However, the utilization of controlled rectifiers or thyristors allows the power to be transmitted reversibly, that is, from the output terminals 10b back to the input terminals 10a, and to the storage inductor 11. The gate or control inputs of the thyristors 32 are connected by control leads 33 to a converter firing angle controller 34 which applies control signals thereto to selectably turn the thyristors on to a conducting state. The controller 34 is also preferably connected by control leads 33 to the blocking thyristor 21 and the bypass thyristor 20. If the converter firing angle controller is set to apply a signal to the gate input of the thyristors 32 at a zero delay angle, the thyristors will function substantially as diodes. However, the converter controller 34 may be set to apply a control input to the thyristors at any desired delay angle, thus allowing additional control over the average voltage level supplied to any load connected to the output terminal 10b. As explained in further detail below, the converter firing angle controller 34 may also be utilized to control the converter 25 to operate it as an inverter, wherein energy stored in the load inductor 19 may be transmitted from the output terminals 10b to the input terminals 10a, either recharging the storage inductor 11 or returning power to the power system through the controlled converter bridge 14.

Figure 2:
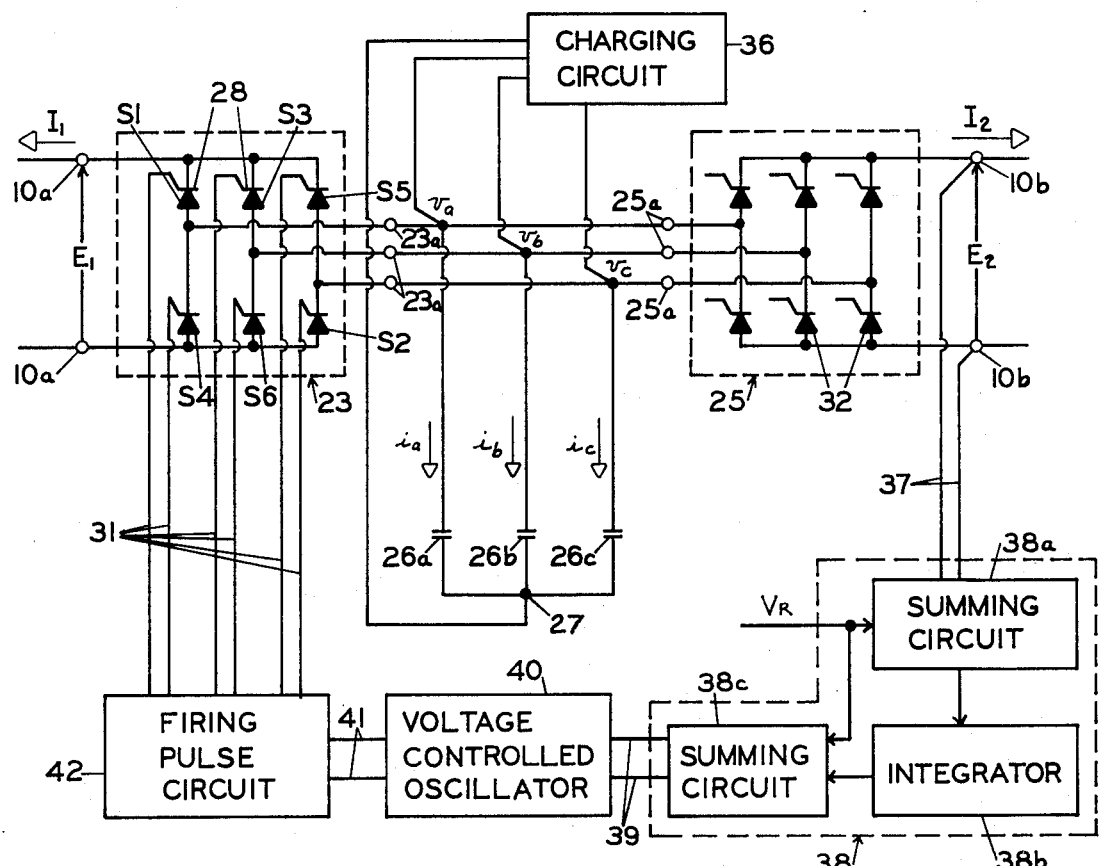
FIG. 2 is a schematic view of the power transfer circuit portion of our power supply shown with control means for regulating the voltage level at the output terminals thereof.

The operation of the power transfer circuit 10 is best shown with reference to FIG. 2, which shows the essential elements of the inverter bridge 23, the converter bridge 25, and the connection of the commutating capacitors 26a, 26b, and 26c therebetween. For purposes of a consideration of the operation of the circuit of FIG. 2, the current $I_1$ flowing through the storage inductor 11 can be considered to be substantially constant. During initial startup, it is assumed that the current $I_2$ through the load inductor 19 is zero. If the gate inputs of all of the thyristors 32 in the converter 25 are blocked, that is, have no input supplied thereto, the load resistor 18 and inductor 19 will be essentially isolated from any voltage appearing at the input terminals 25a of the converter 25. Alteratively, the blocking thyristor 21 may be maintained in an "off" condition to thereby isolate the load resistor and inductor.

If it is assumed that no commutating inductance is present, only two of the thyristors 28 in the inverter 23 will conduct at any given time and the current $I_1$ will commutate from one thyristor to another almost instantaneously. All practical circuits have some small amount of inductance, with the result that the commutation between thyristors is not instantaneous. It may also be desirable to introduce some inductance into the power transfer circuit to slow down the commutation between thyristors. However, the presence of inductance does not substantially change the performance of the transfer circuit, and in the steady state, each pair of thyristors 28 will conduct for approximately a timed period $T_p = 1/(6f)$ where $f$ is the operating frequency in cycles per second (Hz). As shown in FIG. 2, the thyristors 28 in the inverter 23 are denoted as $S_1$ through $S_6$ for purposes of illustrating the firing sequence, wherein the subscript "1" indicates that thyristor $S_1$ and thyristor $S_2$ fire first as a pair, followed by thyristor $S_2$ and thyristor $S_3$, and so forth.

The capacitors 26a, 26b, and 26c are preferably chosen to be substantially equal in capacitance to some chosen capacitance value C. For a constant current $I_1$ flowing through a capacitor of capacitance value C for a time period $T_p$, the change in capacitor voltage is equal to $V_p$ where $V_p = (I_1 T_p)/C$ or $V_p = I_1/6fC$.

It there is no charge on any of the capacitors as an initial condition, Table 1 below gives the inverter output terminal voltages $v_a$, $v_b$, and $v_c$ as a function of a particular pair of thyristors conducting for a time period $T_p$.

Table 1

| Inverter output terminal voltages after conduction time $T_p$ for pairs of thyristors conducting. | | | |
|---|---|---|---|
| Pairs of Thyristors Conducting | $v_a$ | $v_b$ | $v_c$ |
| None initially | 0 | 0 | 0 |
| $S_1, S_2$ | $-V_p$ | 0 | $V_p$ |
| $S_2, S_3$ | $-V_p$ | $-V_p$ | $2V_p$ |
| $S_3, S_4$ | 0 | $-2V_p$ | $2V_p$ |
| $S_4, S_5$ | $V_p$ | $-2V_p$ | $V_p$ |
| $S_5, S_6$ | $V_p$ | $-V_p$ | 0 |
| $S_6, S_1$ | 0 | 0 | 0 |

Figure 4:
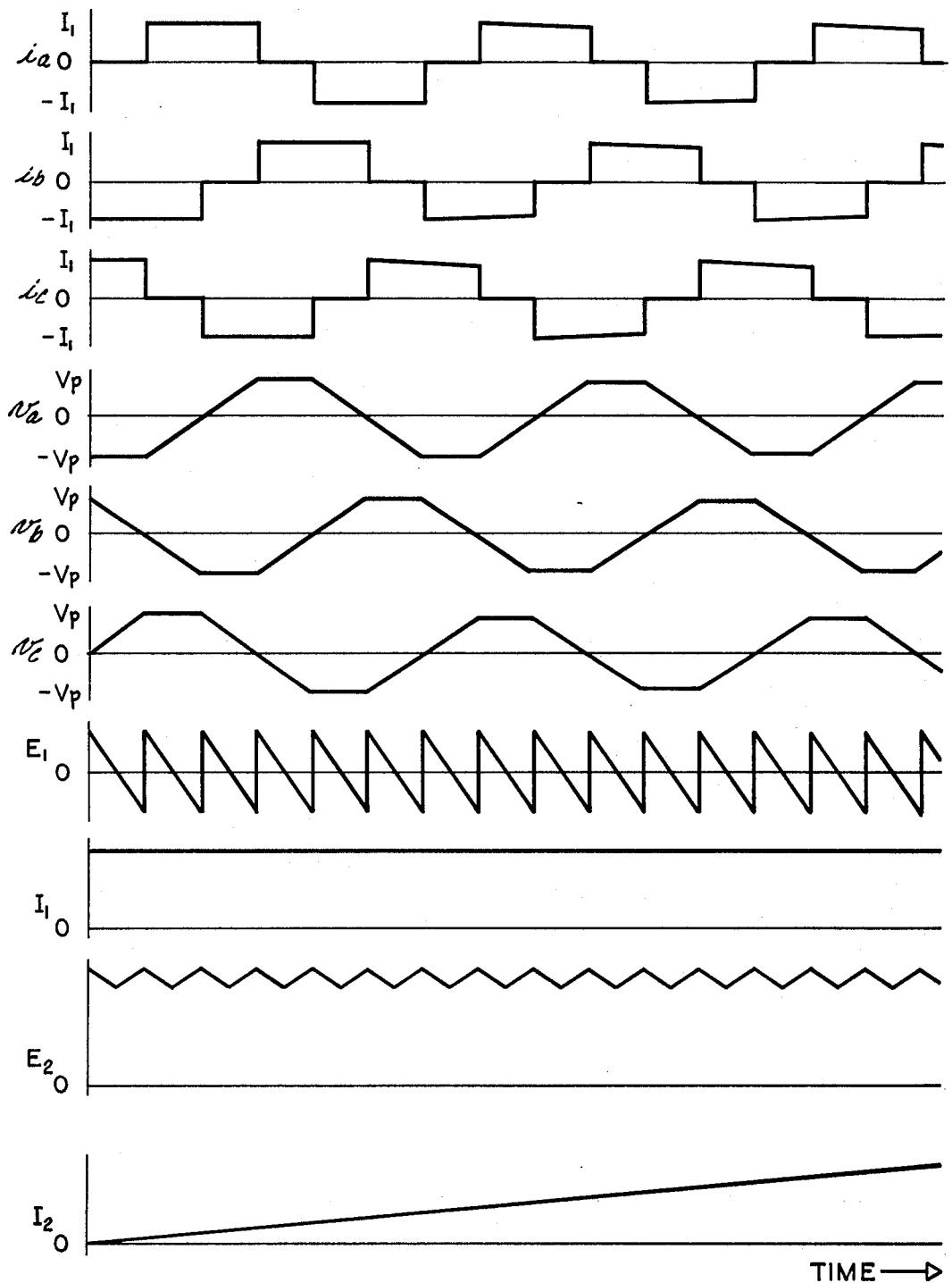
FIG. 4 is a plot of illustrative waveforms of various voltages and currents present in the power supply of FIG. 1.

Table 1 shows that the voltages $v_a$, $v_b$, and $v_c$ will be unbalanced where the initial voltages are all equal to 0. The voltages can be balanced, for example, by utilizing a charging circuit 36 shown in FIG. 2 to cause the initial voltages $v_a = 0$, $v_b = V_p$, and $v_c = -V_p$ such that each phase voltage would vary from $V_p$ to $-V_p$. Voltage wave forms under such conditions for the voltages $v_a$ $v_b$, and $v_c$ are shown in FIG. 4, along with the currents $i_a$, $i_b$, and $i_c$ that flow into the capacitors 26a, 26b, and 26c respectively.

After the three phase intermediate AC voltages have been established by the inverter 23, the converter 25 can be operated in a rectifier mode with the delay angle of the thyristors 32 in the converter set equal to 0. Thus, at any time during the operation of the converter 25, for the three thyristors 32 in the upper half of the converter 25, the one thyristor connected to the most positive of the phase voltages $v_a$, $v_b$, and $v_c$ will conduct. Similarly, the thyristor 32 in the lower half of the converter 25 which is connected to the most negative phase voltage will conduct. The waveform of the resulting output voltage $E_2$ on the output terminals 10b is shown in FIG. 4. The current $I_2$ in the load inductor 19 will build up slowly over a period of time, as shown in FIG. 4, since it has a relatively constant voltage $E_2$ impressed thereon as provided by the power transfer circuit 10, when the frequency of the intermediate voltage waveforms is substantially constant. The decrease in the currents $i_a$, $i_b$, and $i_c$ through the capacitors, and the concurrent slight decrease in the voltages across the capacitors, is shown in somewhat exaggerated terms in FIG. 4 for purposes of illustration, since under ordinary circumstances the current $I_2$ would increase very slowly, and the increase in magnitude of $I_2$ would only be a small fraction of the current $I_1$ during the few cycles of operation shown in FIG. 4. The voltage $E_1$ across the input terminals 10a is also shown for purposes of illustration in FIG. 4. It may be noted that the power transfer circuit 10 provides for commutation of the thyristors 28 and the thyristors 32 without the need for additional commutation circuitry.

The current $I_1$ will decrease to a certain extent over time as it supplies the current $I_2$ built up in the load inductor 19 and the losses associated with the load resistance 18 and other losses in the system. The storage inductor 11 can be "recharged" to its desired capacity by the bridge converter 14 which supplies power to it from an external power system. With reference to FIG. 1, the charging operation can be effected by turning the bypass thyristor 29 on and by turning the bypass thyristors 16 and 17 off. Bypass thyristor 16 would ordinarily be on to bypass the converter 14 when power is being supplied from the storage inductor 11 through the power transfer circuit 10 to the load inductor 19. However, the converter 14 may supply power to the storage inductor 11 even during transfer of power to the load inductor. Commutation of the bypass thyristors 16 and 17 is automatically achieved by operation of converter 14 in the rectifier mode while commutation of the thyristors 20 and 29 may be effected by the charging circuit 36 shown in FIG. 2.

With the bypass thyristors in their proper state for recharging, the storage inductor 11 may now be charged at a maximum rate by operating the converter bridge 14 with zero delay angle. After the current $I_1$ in the storage inductor 11 reaches its desired maximum limit, the delay angle at which the power source converter 14 is operated may be controlled so as to only supply the losses in the system. During periods of nonuse of the power transfer circuit 10, the energy stored in the stoage inductor 11 may be maintained therein with minimum losses by turning on the bypass thyristor 17 so as to allow the current $I_1$ to free wheel therethrough.

The power transfer circuit 10 can be operated to selectively control the output voltage $E_2$ which is impressed across the series combination of the load resistance 18 and the load inductor 19. The output voltage $E_2$ may be regulated at some desired voltage level, or it may be controlled to follow a desired reference voltage. The control of the output voltage $E_2$ is accomplished by controlling the intermediate inversion frequency of the AC voltages $v_a$, $v_b$, and $v_c$. A plot of the output voltage $E_2$ as a function of intermediate inversion frequency f is shown in FIG. 3 and illustrates that the output voltage varies substantially inversely with the intermediate inversion frequency.

Figure 3:
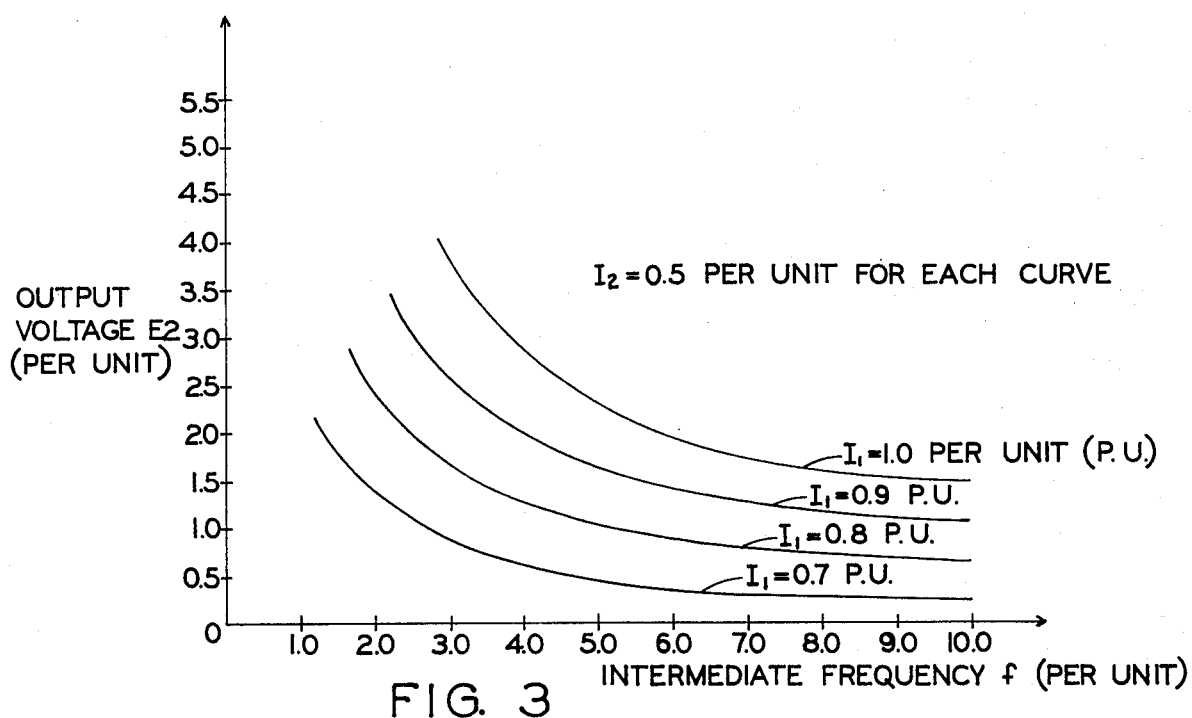
FIG. 3 is a graph of the relationship between the output voltage of the power transfer circuit and the intermediate inversion frequency, with illustrative curves being shown for various values of storage inductor current.

The curves shown in FIG. 3 are for values of current, voltage and frequency which are expressed as "per unit" of arbitrarily selected base system quantities. For example, if the base power equals 5 megawatts, the base voltage 5 kilovolts, and the base frequency 60 Hz (377 rad/sec.), the base current will be 1 kiloamperes, base resistance will be 5 ohms, base inductance 0.0133 henrys, and base capacitance 530.5 microfarads. The curves shown in FIG. 3 are in terms of the base quantities, but the relationships between the quantities displayed therein per base unit will be maintained for any practical values of the base unit quantities. As illustrated therein, the output voltage $E_2$ will, in general, vary inversely with the intermediate inversion frequency for any values of the resistor 18 and load inductor 19. The curves shown in FIG. 3 are for purposes of illustration only, but are representative of the actual curves obtained for various values of the load resistor 18 and inductor 19, and under conditions wherein the load inductor current $I_2$ is assumed to equal 0.5 of the base current unit for each curve. The plot of the intermediate frequency $f$ versus the output voltage $E_2$ is shown for various per unit values of the current $I_1$.

Since the output voltage $E_2$ can be controlled as a function of the intermediate inversion freqency, controlled regulation of the output voltage $E_2$ may be provided in conjunction with the power transfer circuit 10. For example, an error signal $e_R$ can be determined such that $e_R = V_R - E_2$, where $V_R$ is the reference voltage at which the output voltage $E_2$ is to be maintained. The intermediate inversion frequency $f$ may then be generated by feedback control techniques to regulate the output voltage $E_2$ at the desired reference voltage $V_R$ despite system disturbances.

For example, the error signal $e_R$ may be integrated over time and added to the reference voltage $V_R$ to provide a signal level which directly controls the frequency of the control pulses provided to the control inputs of the thyristors 28 in the inverter 23. The integral of the error signal $e_R$ over time is used to enhance the stability of the feedback system, although it is apparent that other compensation techniques may be utilized.

The voltage control described above may be easily implemented using well known circuits in the manner shown in FIG. 2. The output voltage $E_2$ is fed by conducting lines 37 to a reference input circuit 38 which subtracts the output voltage $E_2$ from the voltage reference input $V_R$ by means of a summing circuit 38a to produce the error signal $e_R$. The circuit 38 performs the integration of the error signal by means of an integrator 38b, and combines the output of the integrator with a voltage proportional to the reference voltage $V_R$ by means of a summing circuit 38c, to generate a voltage signal which is proportional to the desired frequency $f$, and provides this voltage on output lines 39 to a voltage controlled oscillator 40. The reference voltage $V_R$ may be multiplied by a gain factor in the summing circuit 38c so that the output voltage from the summing circuit supplied to the voltage controlled oscillator 40 will cause the oscillator 40 to produce an output at the frequency required to generate an output voltage $E_2$ equal to $V_R$. The gain factor required may be determined from a system graph such as that shown in FIG. 3, which shows that the required gain factor will vary somewhat with changes in load inductor and storage inductor current and changes in frequency. However, the gain factor can be assumed to be substantially constant if storage inductor current and inversion frequency do not vary substantially. The gain applied to the error signal $e_R$ may be adjusted to provide satisfactory system response with stability.

The voltage controlled oscillator provides an oscillating voltage signal of frequency equal to the desired frequency $f$ on conducting lines 41 to a firing pulse circuit 42. The firing circuit 42 preferably consists of a ring counter circuit which receives the AC voltage signal from the oscillator 40 and converts it to a series of pulses which are transferred in the proper sequence by the control leads 31 to the gate inputs of the thyristors 28.

To avoid an unbalance in voltage across the capacitors 26a, 26b, and 26c, the inversion frequency is preferably changed only after two or more cycles at the previous operating frequency are completed, and a step change in frequency is not allowed to exceed some small frequency increment after two cycles have been maintained at the previous frequency.

Figure 5:
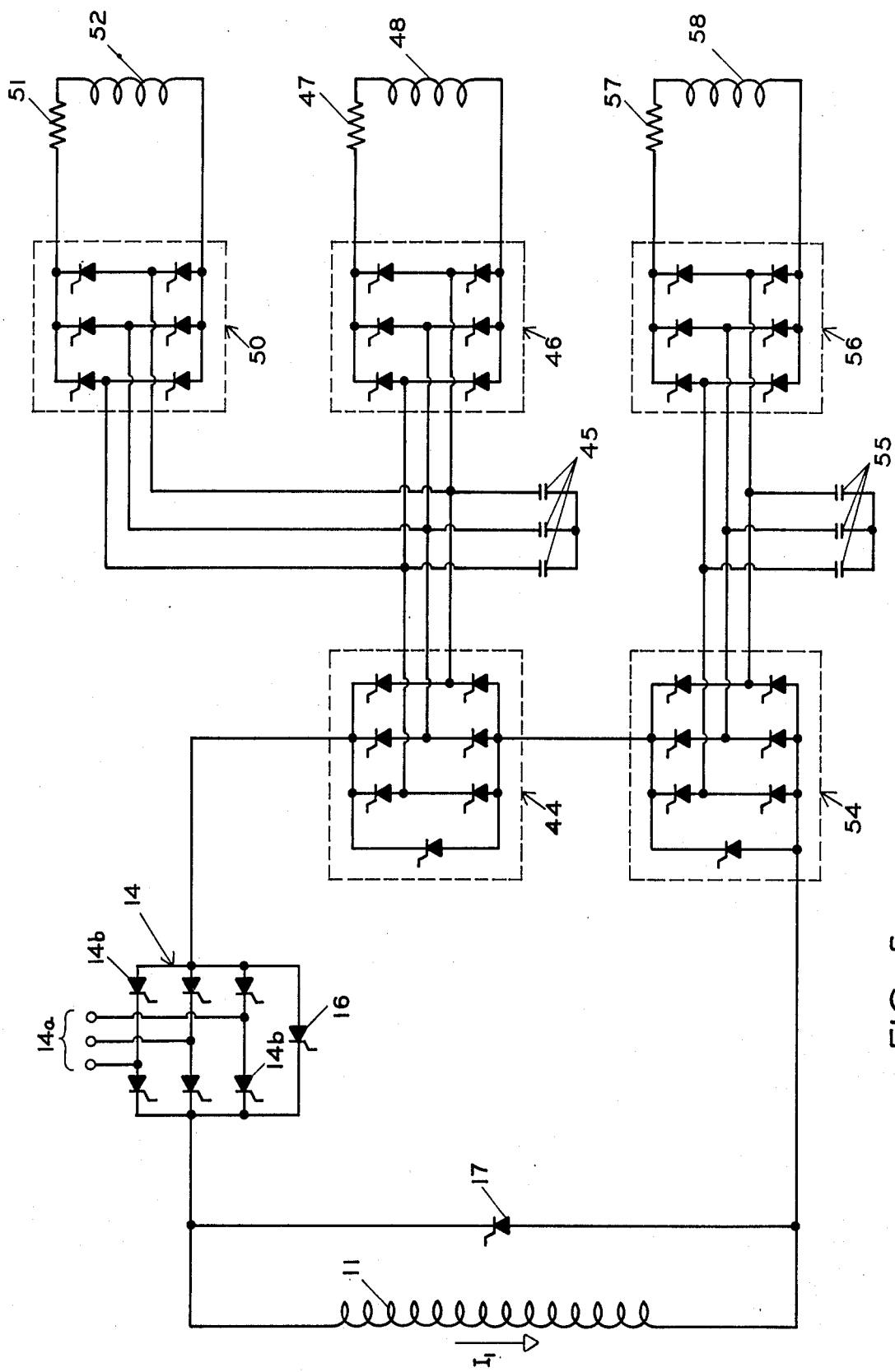
FIG. 5 is a schematic view of an alternative embodiment of our power supply wherein more than one load may be supplied by a single DC source including storage inductor and converter for interfacing with the external power supply source.

The power supply of our invention can be utilized to supply more than one load simultaneously. The supplying of power to multiple loads is illustrated in FIG. 5, which shows a storage inductor 11 with a current $I_1$ flowing through it, and a bridge converter 14 which can be utilized to supply power from a power system to maintain the current $I_1$. The current $I_1$ flows through a first inverter 44 which is identical in all respects to the inverter 23 shown in FIG. 1. The inverter firing angle controller and the other circuit details are not shown in FIG. 5 since they are identical to those shown in FIG. 1. Capacitors 45 are connected across the intermediate output terminals of the inverter 44 in the manner and for the reasons described above for the capacitors 26a, 26b, and 26c of FIG. 1. The output voltages on the three output terminals of the inverter 44 are fed to a first converter 46 which is identical to the converter 25 shown in FIG. 1. The converter 46 rectifies the voltage output of the inverter 44 to a DC voltage and supplies the voltage to a first load resistor 47 and a first load inductor 48. The voltage signals on the output terminals of the first inverter 44 are also fed to a second converter 50, which is again identical to the converter 25 shown in FIG. 1. The second converter 50 rectifies the voltages present on the output terminals of the inverter 44 and provides a DC voltage signal to a second load resistor 51 and a second load inductor 52. It is apparent that the output voltage on the output terminals of the first inverter 44 could be provided to any number of converters which would then rectify the voltage signal and provide a DC voltage to a load. However, the output voltages of the converters 46 and 50 and any additional converters would be substantially identical since they are receiving the same input voltage from the first converter 44.

Where it is desirable to supply more than one load with independent control over the voltages provided to the load, it is necessary to use a second inverter such as that shown generally within the dashed lines labeled 54 in FIG. 5. The second inverter 54 is connected in series with the first inverter 44 and also receives the current $I_1$ flowing through the storage inductor 11. Again, the second inverter 54 is in all respects identical to the inverter 23 shown in FIG. 1, and the inverter firing angle controller and other circuit details are identical also. Three capacitors 55 are connected across the output terminals of the second inverter 54 to allow commutation of the inverter as described above for the power transfer circuit 10. The output voltages present on the output terminals of the second inverter 54 are supplied to a third converter 56 which is identical to converter 25 shown in FIG. 1 and is controlled in the same manner. The third converter 56 rectifies the AC signal applied thereto and provides a DC output voltage signal to a third load resistor 57 and a third load inductor 58. Since the frequency at which the first inverter 44 and the second inverter 54 operate may be controlled independently, it is apparent that the output voltages on the output terminals of these two inverters may be controlled independently of one another.

Our power supply has been described above for circuitry employing three phase intermediate conversion wherein an inverter provides a three terminal, three phase output signal which is subsequently rectified by a converter to provide a DC output voltage. However, it is apparent that single phase inversion may be provided from a single phase inverter with a subsequent rectification of the single phase signal. Also, it is possible to employ a greater number of phases of intermediate inversion than three, and there are some distinct advantages in using a higher number of intermediate phases. For example, a five phase inverter with five parallel pairs of inverting thyristors would provide a five phase output voltage. The higher the number of intermediate phases, the smoother will be the DC output voltages across the loads. Faster response times may be achieved as the number of phases is increased. Any higher number of intermediate phases can be utilized provided that the number of intermediate phases is odd.

Our power supply system can be utilized to transfer power reversibly, that is, from the storage inductor 11 to the load inductor 19, as desired, and then back from the load inductor 19 to the storage inductor 11 or to the power system through the converter bridge 14. This is easily accomplished with out power supply by reversing the functions of the inverter 23 and the converter 25. When a substantial current $I_2$ has been built up in the load inductor 19, it may be desirable to transfer the energy that has been stored in this inductor back to the storage inductor 11 rather than simply allowing it to dissipate in heat in the resistor 18 and in the other circuit components. In order to accomplish this transfer, the converter firing angle controller 34 provides the function that is performed by the inverter firing angle controller 30 for the case of power transfer from the storage inductor to the load inductor.

For the reverse power transfer mode of operation, the converter firing angle controller 34 provides a series of pulses to the gate or control inputs of the converter thyristors 25 to invert the DC signal appearing at the output terminals 10b of the converter (which are also the output terminals of the power transfer circuit 10) to an AC signal at the input terminals 25a of the converter. The operation of the converter 25 in this manner is entirely identical to the operation of the inverter 23 under normal conditions, and thus it is seen that the converter 25 is actually operating as an inverter in this case. Conversely, the inverter firing angle controller 30 is set to apply a series of control pulses to the inputs of the thyristors 28 in the inverter 23 to operate these thyristors as rectifiers. The thyristors 32 in the converter 25 will be commutated by the capacitors 26a, 26b, and 26c in the same manner as the thyristors 28 in the inverter 23 are commutated when power is being transferred in the forward direction. Again, the voltage $E_1$ appearing across the terminals 10a of the power transfer circuit, which are also the input terminals of the inverter 23, will be inversely proportional to the frequency of the intermediate voltages appearing at the terminals 25a of the converter 25. It can be seen that substantially all of the energy that was stored in the load inductor 19 can be "pumped" back into the storage inductor 11 in this manner. Alternatively, the converter bridge 14 may be operated by the adjustable firing angle controller 15 to act as an inverter itself, whereby the DC voltage appearing across the terminals of the converter 14 is inverted to an AC output voltage at the converter input terminals 14a.

Use of controlled rectifying devices such as thyristors in the converter 25 additionally allows substantially complete transfer of the energy stored in storage inductor 11 to the load inductor 19, and vice versa. If the rectifier devices in the converter 25 were simply diodes, power could not be transferred after the current flowing through the load inductor equaled the current flowing through the storage inductor, since there would be no voltage across the commutating capacitors under this condition. However, the firing angles of the thyristors 32 in the converter 25 may be delayed to reduce the output voltage across the load resistor and inductor to always be less than the maximum voltage across the commutating capacitors 26a, 26b, and 26c. While the output voltage $E_2$ cannot be maintained at desired levels under these conditions, operation of the converter in this manner allows power to be transferred even though the storage inductor current is less than the load inductor current. Similarly, power may be transferred from the load inductor to the storage inductor during reverse operation of the power transfer circuit 10 by controlling the firing delay angles of the thyristors 28 in the inverter 23. It may be noted that for normal operation of our power supply, the load inductor current would be considerably less than the storage inductor current.

While our power supply system for high power loads has been described and illustrated above in conjunction with a storage inductor 11 which provides the substantial equivalent of a current source, it is apparent that our power supply including the power transfer circuit 10 and the associated inverter firing angle control means 30 and the converter control means 34, can be utilized to transform a DC voltage $E_1$ at the output terminals 10a to a DC voltage $E_2$ at the output terminals 19b, with the value of the output voltage $E_2$ being controllable as a function of the intermediate inversion frequency at the intermediate output terminals 23a of the inverter. Thus our power supply may be utilized as a DC transformer to change the DC voltage levels in a system without the need for AC transformers with multiple windings and metal cores and the like, which are both expensive and bulky for high voltage, high current systems.

It is understood that our invention is not confined to the particular construction of parts herein illustrated and described for exemplification, but embraces all such modified forms thereof as come within the scope of the following claims.

We claim:

1. A power supply circuit for receiving power from a DC input current source and providing DC output power to a load with a voltage level which is controllable, comprising:
   a. a bridge inverter having input terminals adapted to be connected to the DC input current source and at least two intermediate output terminals, said bridge inverter having a plurality of controlled rectifying devices having control inputs, said controlled rectifying devices being connected together in a bridge circuit between said input terminals and said intermediate output terminals;
   b. commutation means consisting essentially of a capacitor without inductance in parallel therewith connected from each one of said intermediate output terminals of said bridge inverter to a common node for providing commutation of said bridge inverter rectifying devices;
   c. a bridge converter having input terminals connected to said intermediate output terminals of said inverter and having output terminals which are adapted to be connected to the load, said bridge converter having a plurality of rectifying devices connected together in a bridge circuit across said converter input and output terminals such that an AC input voltage provided at said converter input terminals is rectified to provide a DC voltage at said converter output terminals; and
   d. inverter control means connected to said control inputs of said bridge inverter rectifying devices for applying signals thereto to turn said rectifying devices on to a conducting state in a desired time sequence at a desired frequency to produce a varying voltage signal of said desired frequency across said intermediate output terminals of said bridge inverter, whereby the output voltage level at said output terminals of said converter which is provided to the load is substantially inversely proportional to the frequency of the varying voltage signal at said inverter intermediate output terminals when said inverter input terminals are connected to the DC input current source.

2. The circuit as specified in claim 1 wherein said controlled rectifying devices are solid state thyristors.

3. The circuit as specified in claim 1 wherein said rectifying devices in said bridge converter are controllable and have control inputs for receiving control signals to selectably turn said controlled rectifying devices on to a conducting state, and including converter control means for selectively providing input signals to the control inputs of said converter controlled rectifying devices to turn said controlled rectifying devices on to a conducting state at selected firing delay angles.

4. The circuit as specified in claim 3 wherein said converter control means provides input signals to said converter controlled rectifying devices in a desired time sequence at a desired frequency to produce a varying voltage signal of said desired frequency across the input terminals of said converter when said converter output terminals are connected to a source of DC power, and wherein said inverter control means provides input signals to said control inputs of said inverter controlled rectifying devices to turn on said controlled rectifying devices at selected firing delay angles, whereby the voltage level at the input terminals of said inverter is substantially inversely proportional to the frequency of the voltage signal produced at the input terminals of said bridge converter when the output terminals of said bridge converter are connected to a source of DC power.

5. The circuit as specified in claim 1 wherein said inverter control means includes means for comparing the voltage at the output terminals of said bridge converter to a reference voltage to produce an error signal, and wherein the frequency of the signals provided by said inverter control means to the control inputs of said inverter controlled rectifying devices is controlled by said reference voltage and said error signal to maintain the output voltage at the converter output terminals substantially equal to the reference voltage.

6. The circuit as specified in claim 1 wherein said commutation means consists essentially of a capacitor without inductance in parallel therewith connected between each pair of said inverter intermediate output terminals.

7. The circuit as specified in claim 1 wherein said bridge inverter comprises a plurality of pairs of serially connected thyristors with each of said pairs of thyristors being connected in parallel across the input terminals of said bridge inverter, and with the connection between each pair of thyristors being connected to one of the output terminals of said bridge inverter, said thryistors being poled to conduct forwardly in the direction of the DC current flowing into said bridge inverter.

8. A power supply for providing a controllable DC voltage to a load, comprising:
  a. an electrical energy storage inductor;
  b. a bridge inverter having input terminal electrically connected to said storage inductor and at least two intermediate output terminals, said bridge inverter having a plurality of controlled rectifying devices having control inputs, said controlled rectifying devices being connected together in a bridge circuit between said input terminals and said intermediate output terminals;
  c. commutation means consisting essentially of a capacitor without inductance in parallel therewith connected from each one of said intermediate output terminals of said bridge inverter to a common node for providing commutation of said bridge inverter rectifying devices;
  d. a bridge converter having input terminals connected to said intermediate output terminals of said inverter and having output terminals which are adapted to be connected to the load, said bridge converter having a plurality of rectifying devices connected together in a bridge circuit across said converter input and output terminals such that an AC input voltage provided at said converter input terminals is rectified to provide a DC voltage at said converter output terminals; and
  e. inverter control means connected to said control inputs of said bridge inverter rectifying devices for applying signals thereto to turn said rectifying devices on to a conducting state in a desired time sequence at a desired frequency to produce a varying voltage signal of said desired frequency across said intermediate output terminals of said bridge inverter, whereby the output voltage level at said output terminals of said converter is substantially inversely proportional to the frequency of the varying voltage signal at the inverter intermediate output terminals when DC current is supplied by said electrical energy storage inductor.

9. The power supply as specified in claim 8 wherein said controlled rectifying devices are solid state thyristors.

10. The power supply as specified in claim 8 wherein said rectifying devices in said bridge converter are controllable and have control inputs for receiving control signals to selectably turn said controlled rectifying devices on to a conducting state, and including converter control means for selectively providing input signals to the control inputs of said converter controlled rectifying devices to turn said controlled rectifying devices on to a conducting state at selected firing delay angles.

11. The power supply as specified in claim 10 including a load inductor connected to the output terminals of said converter.

12. The power supply as specified in claim 11 wherein said converter control means provides input signals to said converter controlled rectifying devices in a desired time sequence at a desired frequency to produce a varying voltage signal of said desired frequency across the input terminals of said converter when said converter output terminals are connected to a source of DC power, and wherein said inverter control means provides input signals to said control inputs of said inverter controlled rectifying devices to turn on said controlled rectifying devices at selected firing delay angles, whereby the voltage level at the input terminals of said inverter is substantially inversely proportional to the frequency of the voltage signal produced at the input terminals of said bridge converter when said load inductor has energy stored therein and power is being transferred from said load inductor back to said storage inductor.

13. The power supply as specified in claim 8 wherein said inverter control means includes means for comparing the voltage at the output terminals of said bridge converter to a reference voltage to produce an error signal, and wherein the frequency of the signals provided by said inverter control means to the control inputs of said inverter controlled rectifying devices is controlled by said reference voltage and said error signal to maintain the output voltage at the converter output terminals substantially equal to the reference voltage.

14. The power supply as specified in claim 8 wherein said commutation means consists essentially of a capacitor without inductance in parallel therewith connected between each pair of said inverter intermediate output terminals.

15. The power supply as specified in claim 8 wherein said bridge inverter comprises a plurality of pairs of serially connected thyristors with each of said pairs of thyristors being connected in parallel across the input terminals of said bridge inverter, and with the connection between each pair of thyristors being connected to one of the ouput terminals of said bridge inverter, said thyristors being poled to conduct forwardly in the direction of the DC current flowing into said bridge inverter.

16. The power supply as specified in claim 8 including a power system bridge converter having input terminals adapted to be connected to an AC power system and having output terminals which are connected in series with said storage inductor, said power system bridge converter having a plurality of controlled rectifying devices having control inputs, said controlled rectifying devices being connected in a bridge circuit between said input terminals and said power system bridge converter output terminals, and including adjustable firing angle control means to provide control signals to the control inputs of said converter controlled rectifying devices to selectively provide rectified power to said storage inductor from the AC power system.

17. The power supply as specified in claim 8 wherein said energy storage inductor has a superconductive winding.

* * * * *